(12) United States Patent
Stabler

(10) Patent No.: US 6,847,200 B1
(45) Date of Patent: Jan. 25, 2005

(54) PORTABLE TESTER FOR WATT HOUR METER

(76) Inventor: Dwight W. Stabler, 562 Southbound Rd., Gaston, SC (US) 29053

( * ) Notice: Subject to any disclaimer, the term of this patent is extended or adjusted under 35 U.S.C. 154(b) by 0 days.

(21) Appl. No.: 09/169,024

(22) Filed: Oct. 9, 1998

(51) Int. Cl.$^7$ .............................................. G01R 11/32
(52) U.S. Cl. ...................... 324/74; 324/142; 324/158.1; 324/110
(58) Field of Search ........................... 324/99 D, 103 R, 324/130, 110, 133, 141, 142, 76.11, 107, 74; 702/60–61; 340/657, 660, 661, 662, 663–664

(56) References Cited

U.S. PATENT DOCUMENTS

| | | | |
|---|---|---|---|
| 1,942,063 A | | 1/1934 | Kinnard ........................ 324/74 |
| 2,093,178 A | | 9/1937 | Wagner ........................ 324/74 |
| 2,249,075 A | * | 7/1941 | Young et al. .................. 324/74 |
| 4,158,808 A | | 6/1979 | Massa et al. .................. 324/74 |
| 4,271,390 A | | 6/1981 | Canu ............................ 324/74 |
| 4,583,043 A | | 4/1986 | Phillips ....................... 324/110 |
| 4,605,895 A | * | 8/1986 | Park ............................ 324/133 |
| 4,646,003 A | * | 2/1987 | Phillips et al. ................ 324/74 |
| 4,854,165 A | * | 8/1989 | Jay ............................. 73/168 |
| 4,922,185 A | * | 5/1990 | Davidson et al. ............. 324/74 |
| 5,017,877 A | | 5/1991 | Haus, Jr. ..................... 324/546 |
| 5,270,658 A | * | 12/1993 | Epstein ....................... 324/424 |
| 5,650,717 A | * | 7/1997 | Draus et al. .................. 324/74 |
| 5,821,742 A | * | 10/1998 | Carr et al. .................... 324/74 |

* cited by examiner

Primary Examiner—Vinh P. Nguyen

(57) ABSTRACT

A field load tester for electric watt hour meters having a case enclosing an electrical circuit capable of carrying up to 240 volts of electricity, which circuit having at least a pair of connection leads, one of which is connected in series through a fuse, a thermostat, a circuit breaker, and an element with at least two terminals, one of the leads is connected to one of the terminals and the other lead is connectd to the element at the other terminal, with a light connected between the element terminals. Connecting the tester to the ground and load of a meter by use of clips or probes at the ends of the connection leads creates a load on the line causing the eddy current disc of the meter to turn if the meter is operational.

19 Claims, 5 Drawing Sheets

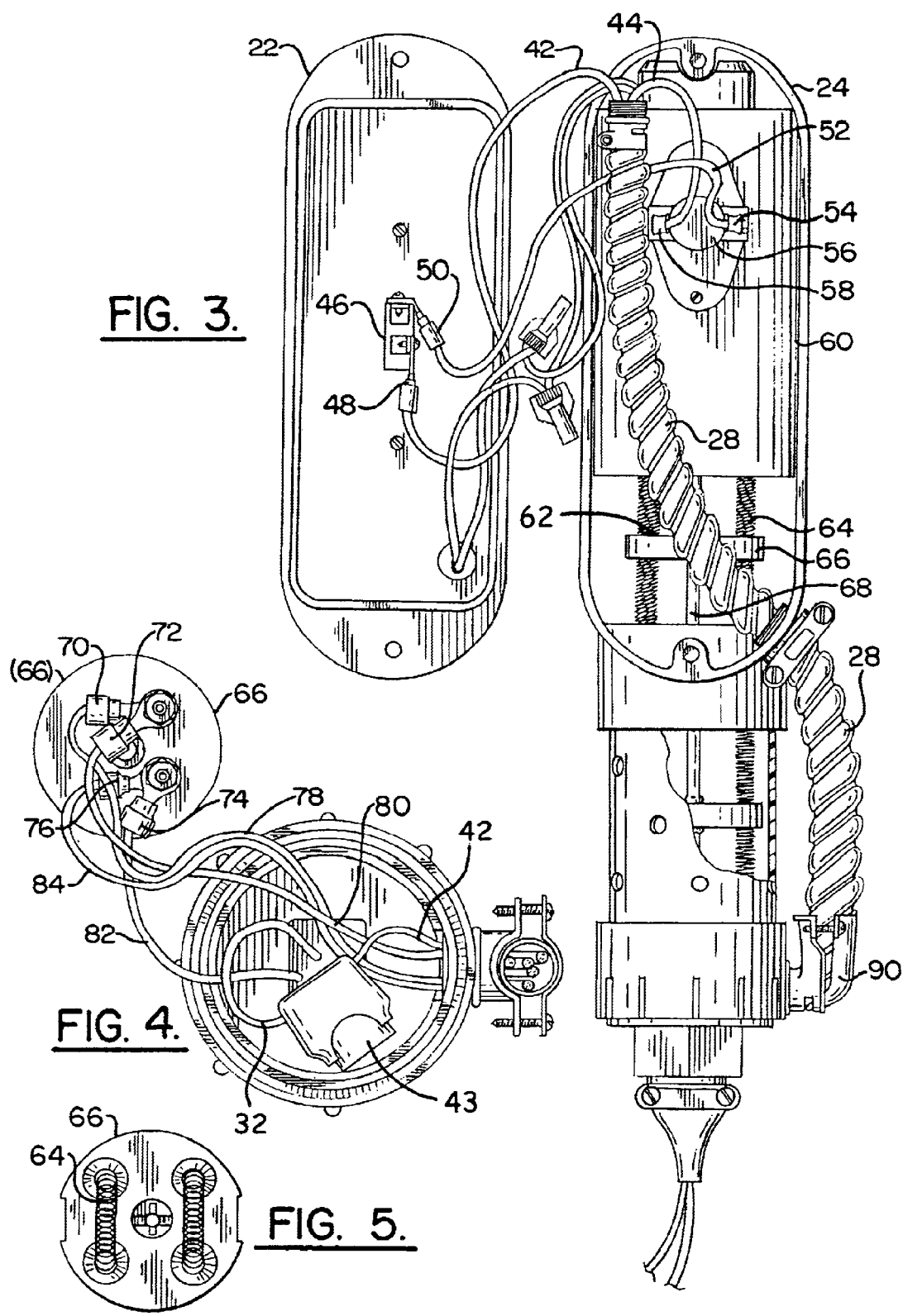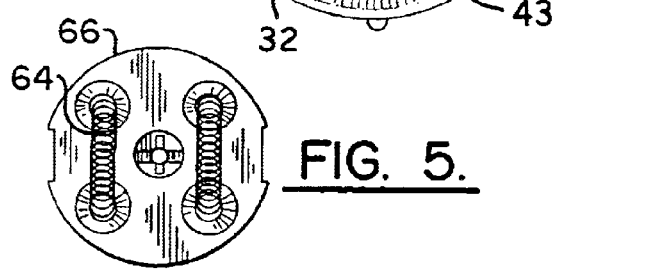

208V OR 240V
LOAD

208V OR 240V
LOAD

208V OR 240V
LOAD

PORTABLE TESTER FOR WATT HOUR METER

BACKGROUND OF THE INVENTION

The present invention relates to electric power meters and more particularly to a device for testing the flow of electricity through an electric watt hour meter.

Utility companies frequently have watt hour meters indicating no use or less than normal use each billing period. Field personnel are dispatched to check the meters that appear to be nonoperational. Usually, a nonoperational meter is disconnected, replaced with a temporary meter, and the nonoperational meter is taken to a laboratory for testing. This necessarily disrupts service to the customer and costs the utility company for the man-hours of field and lab personnel as well as the expense of handling the accounting and billing for the customer during the disruption of service. It is known that of the meters disconnected and sent to a lab for testing, approximately 95% are actually operational and only 5% have actually stopped being functional. This knowledge indicates that considerable time and expense could be saved if apparently nonoperational meters could be checked in the field rather than being disconnected and sent to a lab for testing.

Many attempts have been made to provide field testing means without the need of removing the meter from service. Several devices incorporate a detecting means or mechanism within the meter. Unfortunately, these may be thwarted by unscrupulous consumers or may just fail, and because they are within the meter, may not be detected as the reason for no recorded consumption of power by the meter.

Another device for site testing a meter employs two clip-on transformers, one for connection about an inlet power conduit from the electric utility and the other about an inlet power supply to the consumer. Electric current measuring means determines any difference in the current sensed by the two transformers. Unfortunately, this device requires the individual power conductors to be accessible and this generally is not the case; the conductors normally being enclosed within a cable containing the return conductor. A transformer around such cable will detect zero current.

Other devices rely on magnetic flux to indicate the presence of an electric current within the meter. At least one such magnetic flux indicator (MFI) uses a mechanical analog indicator which is orientation sensitive and difficult or impossible to use on a meter located above shoulder height.

There is accordingly a need for a portable, easily used device for field testing electric watt hour meters. Such a device should be simple to learn to use and implement so that field personnel may quickly determine if an apparently nonoperational meter is actually operational.

SUMMARY OF THE INVENTION

Therefore, it is an object of the present invention to provide a portable, easily utilized device that can be carried by meter testing personnel or other field workers to detect loads passing through electric watt hour meters, particularly in single-phase and three-phase meters, up to 240 volts.

Another object is to provide a portable meter tester that assists in identifying nonfunctioning meters in the field, thus eliminating the need to disconnect and transport to a laboratory meters that are functioning properly, but for one reason or another do not indicate a load prior to testing by field personnel. The vast majority of meters-appearing to be nonoperational and therefore removed and sent to a lab for repair are actually functioning properly, but at the time of observation are not under a load so the disc shows no movement. The present invention utilizes power from the service to create an artificial load that will turn the disc in the meter if it is functioning properly. Meters with open potential clips will not function properly and therefore may be identified and removed to a service lab for repair.

A further object of the present invention is to provide a convenient method for testing watt hour meters in the field. The method of use of the present invention is simple, safe, fast, convenient, and easy to accomplish in the field. It may be used on any voltage supplied by the utility company up to 240 volts AC.

In accordance with one aspect of the present invention there is provided a portable meter tester comprising in combination a case enclosing an electrical circuit capable of carrying up to 240 volts of electricity, this circuit is further comprised of at least a pair of connection leads, one of which is connected in series through a fuse, a thermostat, a circuit breaker, and an element with at least two terminals, with the first lead connected to one of the terminals and the other connection lead connected to the element at the other terminal, with a light connected between these element terminals. In use the meter tester is connected to the load side of the meter "and on any switch box, fuse box, disconnect, or where any device is attached to system on the load side of the meter" by closing a circuit with a clip attached to the neutral or ground line and another clip attached to one of the phase lines. A test may also be conducted on a phase to phase circuit similarly constructed.

BRIEF DESCRIPTION OF THE DRAWINGS

The present invention will be better understood after reading the following detailed description of the presently preferred embodiment thereof with reference to the appended drawings in which:

FIG. 3 is a plan view of the assembled device of the present invention with the cover removed to show the internal components;

FIG. 4 is a transverse sectional view of the cap end of the present invention with the cap opened to show the internal components;

FIG. 5 is an end view of the resistance component of the present invention;

The same reference numerals are used throughout the drawings to designate the same or similar parts.

DETAILED DESCRIPTION OF THE PRESENTLY PREFERRED EMBODIMENT

Figures 1, 2:
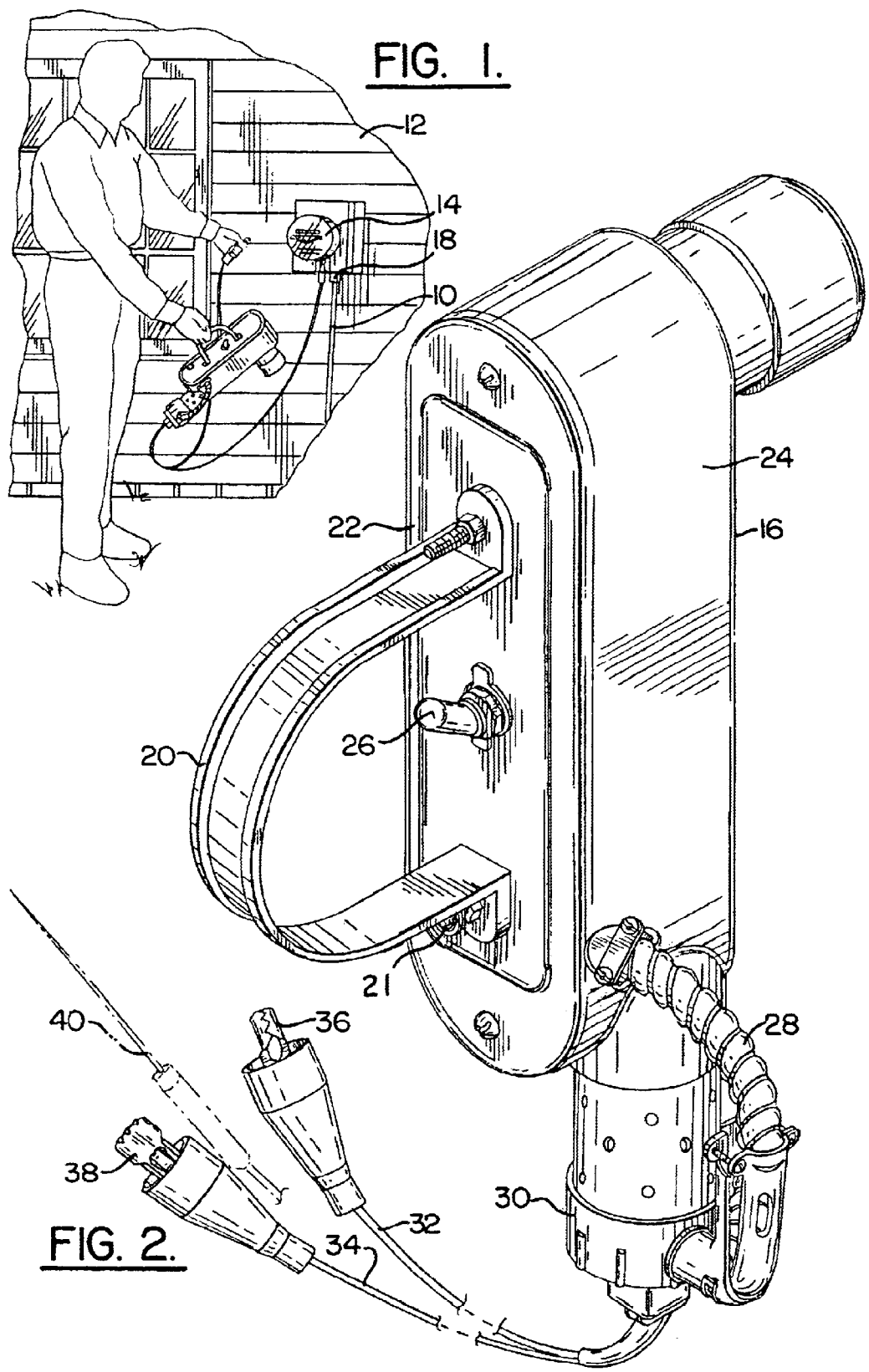
FIG. 1 is a perspective view of the present invention in the hands of a field worker testing a meter in a typical installation.
FIG. 2 is a perspective view of the present invention drawn to an enlarged scale and illustrating optional clip or probe connection means.

Referring to the drawings, there is shown in FIG. 1 a typical electric meter installation consisting of a service entrance conductor 10 which provides electric service to the building 12 after passing through a watt hour meter 14. The illustrated field worker is holding the tester device of the present invention in his right hand and preparing to connect the tester to the load with a clip held in his left hand having already grounded the tester to meter 14 with another clip at ground 18 (which could be the box of meter 14). This illustration is exemplary only as to the electric service, the meter, the worker, and the building since the invention concerns itself with the testing device and method of testing a watt hour meter.

Referring now to FIG. 2, an enlarged scale illustration of tester 16 more clearly shows the handle 20 mounted to the cover 22 which is attached to the case 24. Under handle 20 on cover 22 is a switch 26 which may be of the toggle type. At the lower portion of case 24, conduit 28 protrudes and reenters case 24 at bottom cap 30. From bottom cap 30 extend a first line 32 and a second line 34. First line 32 is attached to first clip 36 and second line 34 is attached to second clip 38. While the device, has been depicted with clips, it should be apparent that one or more probes may be substituted for one or both clips. Shadowed in near second clip 38 in this illustration is an optional probe 40 which may replace either or both of clips 36 and 38, depending on the type meter to be tested by tester 16.

In FIG. 3, cover 22 has been laid open to reveal the continuation of conduit 28 housing first switch wire 42. Switch wire 42 is connected to switch 26 (not visible in this illustration as switch 26 is on the other side of cover 22) at a connector 46 by a compression clamp 48. At connector 46, a second compression clamp 50 connects switch 26 with a second wire 52 which also connects by a bladed connector 54 to a thermostat 56. To complete the circuit through thermostat 56, another bladed connector 58 connects thermostat 56 to a thermostat wire 44 which travels into conduit 28. Behind a flashing 60, which most preferably is made of aluminum, is an element 62 made of steel coils 64 held in place by porcelain insulators 66 on a support rod 68 continues the circuit. Element 62 may be a dry water heater element of the type commercially available today.

FIG. 4 depicts the various wires and connections in the lower portion of tester 16. The lowermost insulator 66 of element 62 is connected by a first compression connector 70, a second compression connector 72, a third compression connector 74, and a fourth compression connector 76 to a ground wire 78, a first light wire 80, a circuit wire 82, and a second light wire 84, respectively. These wires collectively pass through a flex (21) connector 90 (illustrated in FIG. 3) to unite with switch 26, thermostat 56, and a light. First light wire 80 and second light wire 84 feed to a light 21 (see FIG. 2) in cover 22. The light (21) will glow when the circuit is complete. Circuit wire 82 completes the circuit of switch 26, thermostat 56, element 62, first clip 36 and second clip 38, and meter to be tested. When first clip 36 and second clip 38 are clipped to the meter to be tested, switch 26 may be activated, allowing element 62 to create resistance which registers as a turning eddy current disc in an operational meter. The light 21 in cover 22 glows as an indication of a complete circuit.

Figure 6:
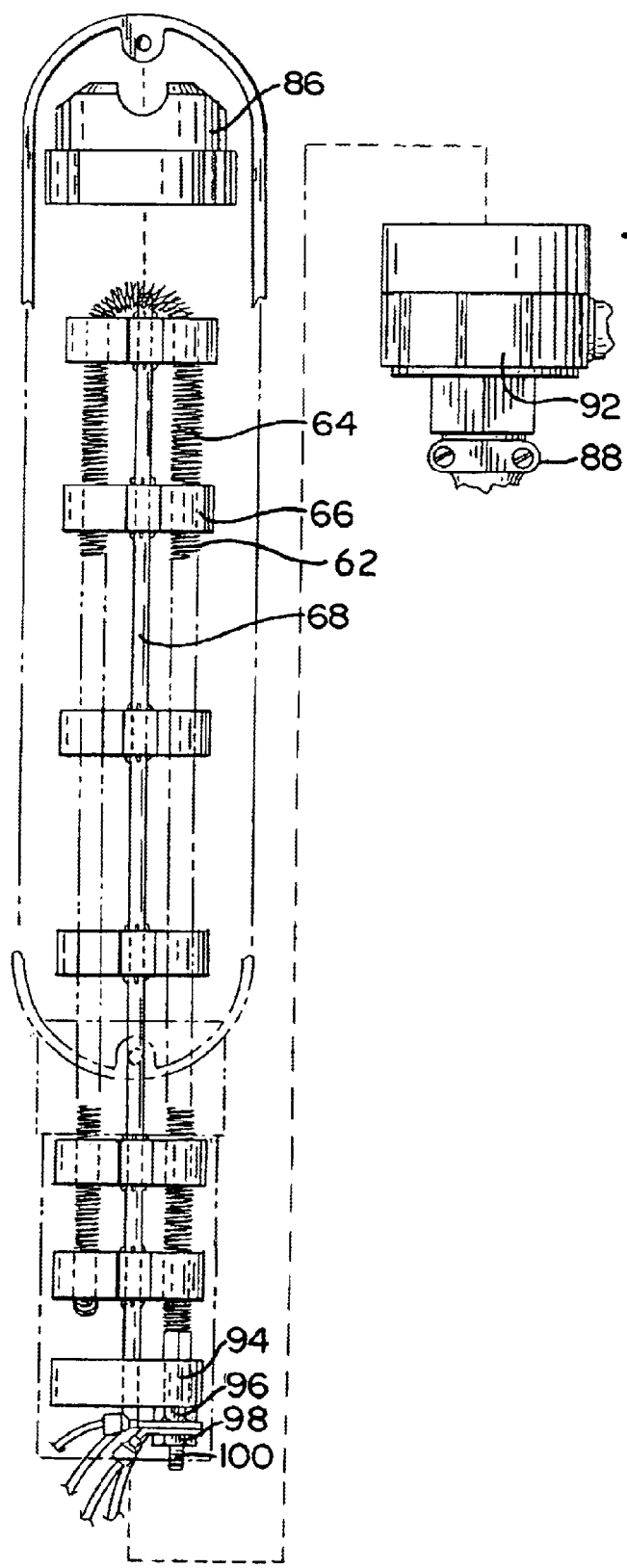
FIG. 6 is a longitudinal sectional view of the present invention with the cap end shown exploded.

FIG. 5 illustrates the uppermost insulator 66 of element 62. Coils 64 loop back through insulator 66 at this location. Referring to FIG. 6, the looping of coils 64 is also depicted in another orientation. Support rod 68 holds several spaced insulators 66 which carry coils 64. Also depicted is an insulator 86, placed above element 62 to deflect heat given off during the testing of a meter. Insulator 86 may be made of any suitable heat-resistant material. At the other end of tester 16, a screw-on cap 92 carries a wire connector 88 which serves to carry first line 32 and second line 34. Above and inside cap 92 is located a lowermost insulator 94 (also depicted as insulator 66 in FIG. 4) with terminal post 100 threaded to receive a washer 96 and a nut 98. Between washer 96 and nut 98 connection of wires 82 and 84 is made with compression connectors 74 and 76, respectively.

Figure 7A:
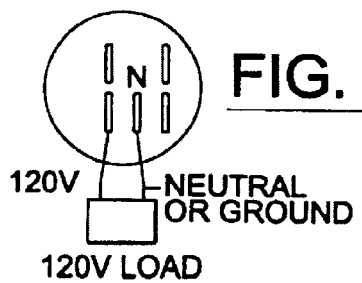
FIG. 7A is a diagrammatic illustration of a mode of testing a 120 volt single-phase meter, or a 240 volt single-phase meter.
Figure 7B:
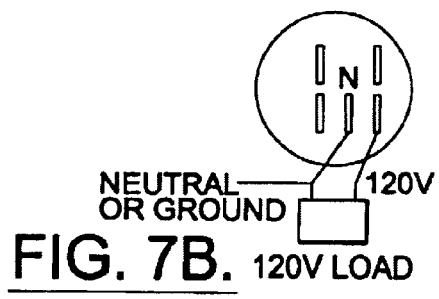
FIG. 7B is a diagrammatic illustration of a second mode of testing a 240 volt single-phase meter.
Figure 7C:
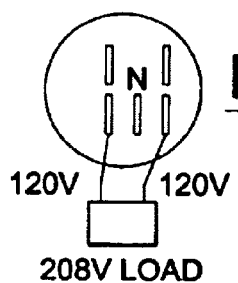
FIG. 7C is a diagrammatic illustration of a first mode of testing a 208 volt single-phase meter.
Figure 7D:
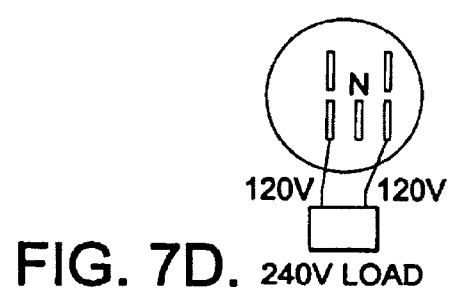
FIG. 7D is a diagrammatic illustration of a third mode of testing a 240 volt single-phase meter.
Figure 7E:
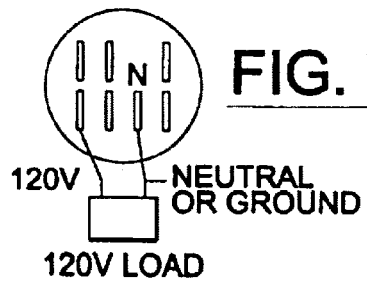
FIG. 7E is a diagrammatic illustration of a first mode of testing a 120 volt three-phase meter.
Figure 7F:
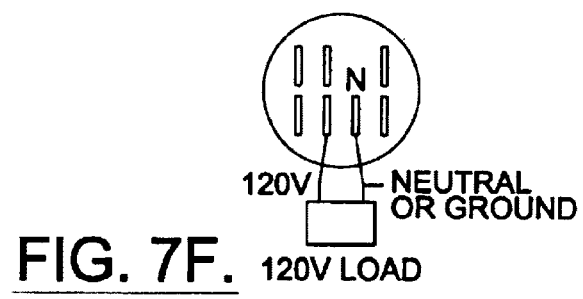
FIG. 7F is a diagrammatic illustration of a second mode of testing a 120 volt three-phase meter.
Figure 7G:
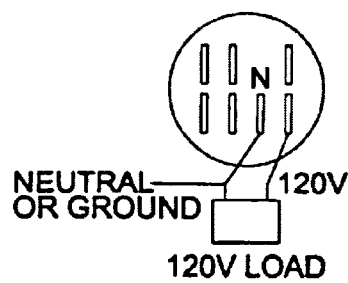
FIG. 7G is a diagrammatic illustration of a third mode of testing a 120 volt three-phase meter.
Figure 8A:
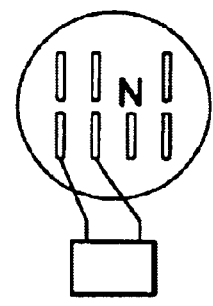
FIG. 8A is a diagrammatic illustration of a first mode of testing a 208 or 240 volt three-phase meter.
Figure 8B:
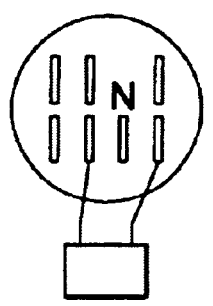
FIG. 8B is a diagrammatic illustration of a second mode of testing a 208 or 240 volt three-phase meter.
Figure 8C:
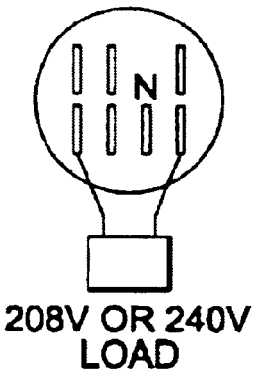
FIG. 8C is a diagrammatic illustration of a third mode of testing a 208 or 240 volt three-phase meter.

FIGS. 7A–8C are schematics for testing various types of single-phase and threes phase meters. In each illustration, the circle represents the face of a meter, the thin vertical rectangles represent the terminals of the meter, with the letter "N" above the neutral. The square below the circle represents the load, and the lines between the load and the terminals represent the first and second lines of the device of the present invention. In operation, the field personnel determines what type meter is to be tested and proceeds with the appropriate placement of the lines. The lines may be attached to the terminals by clips or held in contact with the terminals by probes. FIG. 7A illustrates placement of lines for a first mode of testing a 120 volt single-phase meter. It should be apparent that this mode of testing also applies to 240 volt single-phase meters as well. FIG. 7B illustrates placement of lines for a second mode of testing a 120 volt single-phase meter. Again, it should be apparent that this mode of testing may also apply to 240 volt single-phase meters. FIG. 7C illustrates placement of lines for a first mode of testing a 208 volt single-phase meter. FIG. 7D illustrates placement of lines for a third mode of testing a 240 volt single-phase meter. FIG. 7E illustrates placement of lines for a first mode of testing a 120 volt three-phase meter, by placing the first line to the first phase and the second line to the neutral. FIG. 7F illustrates placement of lines for a second mode of testing a 120 volt three-phase meter, by placing the first line to the second phase and the second line to the neutral. FIG. 7G illustrates placement of lines for a third mode of testing a 120 volt three-phase meter, by placing the first line to the third phase and the second line to the neutral. FIG. 8A illustrates a first mode of testing a 208 or 240 volt three-phase meter, by testing the first phase to the second phase. FIG. 8B illustrates a second mode of testing a 208 or 240 volt three-phase meter, by testing the second phase to the third phase. FIG. 8C illustrates a third mode of testing a 208 or 240 volt three-phase meter, by testing the first phase to the third phase. It should be apparent that these illustrations are but a sampling of testing methods for single and poly-phase meters.

Having described the device and method of using the invention with reference to the presently preferred embodi-

I claim:

1. An electric meter operation testing device, comprising:
   a case enclosing an electrical circuit capable of carrying up to 240 volts of electricity;
   said circuit comprising at least a pair of connection leads, the first lead of said pair connected in series through a circuit breaker to an element capable of generating a measurable resistance with at least two terminals, said first lead connected to one of said terminals;
   the second terminal of said element connected to the second of said pair of connection leads;
   a light connected in series between said second terminal of said element and said second connection lead.

2. An electric meter operation testing device according to claim 1, wherein said circuit further comprises a fuse between said first lead and said circuit breaker.

3. An electric meter operation testing device according to claim 2, wherein said fuse is capable of carrying 20 amps.

4. An electric meter operation testing device according to claim 1, wherein said circuit further comprises a thermostat between said first lead and said circuit breaker.

5. An electric meter operation testing device according to claim 4, when said thermostat is a 150° F. thermostat with a cool-down reset of 20° F.

6. An electric meter operation testing device according to claim 1, wherein said circuit breaker is an off-on switch.

7. An electric meter operation testing device according to claim 1, wherein said light is a ⅓ watt, 250 volt red light.

8. An electric meter operation testing device according to claim 1, wherein said pair of connection leads end in clips.

9. An electric meter operation testing device according to claim 1, wherein said first of said pair of connection leads ends in a clip and said second of said pair of connection leads ends in a probe.

10. An electric meter operation testing device according to claim 1, wherein said element is a 240 volt 2000 watt element.

11. An electric meter operation testing device according to claim 1, wherein said element is a 240 volt 2000 watt dry water heater element.

12. A method for testing the operation of a single phase electric meter comprising the steps:
    attaching one of a pair of connection leads from a device comprising an electrical circuit with means for generating a resistance and means for noting the generation of said resistance capable of carrying up to 240 volts of electricity to a neutral or ground on said meter;
    attaching the other of said pair of connection leads from said device to a terminal of said meter;
    activating said circuit;
    generating a resistance;
    noting the generation of said resistance;
    noting the activation of said meter; then
    disengaging said connection leads from said meter.

13. A method for testing the operation of a single phase electric meter according to claim 12, wherein said resistance generating means comprises an element with at least two terminals, one of said connection leads connected to one of said terminals, said element being at least a 240 volt 2000 watt element such that electric current from said meter meets resistance in said element and causes activation of a disc in said meter.

14. A method for testing the operation of a single phase electric meter according to claim 12, wherein said generation noting means comprises a light in series in said circuit between said second of said connection leads and said second terminal of said element, such that said light glows when resistance occurs in said circuit.

15. A method for testing the operation of a single phase electric meter according to claim 12, wherein said activation noting means is visible movement of an eddy current disc in said meter.

16. A method for testing the operation of a poly-phase electric meter comprising the steps:
    attaching one of a pair of leads from a device comprising an electrical circuit capable of carrying up to 240 volts of electricity to a first phase terminal of said meter;
    attaching the second of said pair of leads to a second phase terminal of said meter;
    activating said circuit;
    generating a resistance;
    noting the generation of said resistance;
    noting the activation of said meter;
    disengaging said connection leads from said meter; then
    repeating said method with attachments of said leads to said second phase terminal and a third phase terminal of said meter.

17. A method of testing the operation of a poly-phase electric meter according to claim 16, wherein said circuit comprises said first of said pair of connection leads connected in series through a fuse, a thermostat, a circuit breaker, and an element, while said second of said pair of connection leads is connected through a light to said element, the steps:
    attaching said first lead to a first phase terminal of said meter;
    attaching said second of said leads to a second phase terminal of said meter;
    activating said circuit by closing said circuit breaker;
    generating a resistance;
    noting the generation of said resistance;
    noting the activation of said light;
    detaching said pair of connection leads from said meter; then
    repeating said attaching sequence for each combination of the poly-phase terminals of said meter.

18. A method of testing the operation of a poly-phase electric meter according to claim 16, wherein said element is a 240 volt 2000 watt element.

19. A method of testing the operation of a poly-phase electric meter according to claim 16, wherein said element is a 240 volt 2000 watt dry water heater element.

* * * * *